US012588347B2

(12) United States Patent　　　(10) Patent No.:　US 12,588,347 B2

Ogawa　　　　　　　　　　　　(45) Date of Patent:　Mar. 24, 2026

(54) DISPLAY DEVICE

(71) Applicant: Japan Display Inc., Tokyo (JP)

(72) Inventor: Akihiro Ogawa, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 657 days.

(21) Appl. No.: 17/956,989

(22) Filed: Sep. 30, 2022

(65) Prior Publication Data

US 2023/0025876 A1　Jan. 26, 2023

Related U.S. Application Data

(63) Continuation of application No. PCT/JP2021/002304, filed on Jan. 22, 2021.

(30) Foreign Application Priority Data

Apr. 1, 2020　(JP) ................................. 2020-066057

(51) Int. Cl.
　*H10H 29/856*　(2025.01)
　*H10H 29/01*　(2025.01)
　*H10H 29/34*　(2025.01)
　*H10H 29/853*　(2025.01)

(52) U.S. Cl.
　CPC ........ *H10H 29/856* (2025.01); *H10H 29/012* (2025.01); *H10H 29/0362* (2025.01); *H10H 29/0363* (2025.01); *H10H 29/34* (2025.01); *H10H 29/853* (2025.01)

(58) Field of Classification Search
　CPC .. H10H 20/841; H10H 20/853; H10H 20/856; H10H 29/8421; H10H 29/853; H10H 29/856; H10H 29/012; H10H 29/30–49; H01L 25/0753
　See application file for complete search history.

(56) References Cited

U.S. PATENT DOCUMENTS

2021/0082892 A1　3/2021　Kanaya et al.
2021/0082995 A1*　3/2021　Ikeda ................... H10H 20/857

FOREIGN PATENT DOCUMENTS

JP　　　2019-212694 A　12/2019
WO　WO-2019230050 A1 *　12/2019　......... H01L 25/0753

OTHER PUBLICATIONS

English langauge translatin of WO2019230050. (Year: 2019).*

* cited by examiner

*Primary Examiner* — Yu Chen
(74) *Attorney, Agent, or Firm* — XSENSUS LLP

(57) ABSTRACT

According to one embodiment, a display device includes an organic insulating layer, a light reflecting layer, a light emitting element, a sealing layer having an inclined surface having a lower end and an upper end, and a coating layer. An interface between the inclined surface and the coating layer is configured to reflect light traveling through the sealing layer toward the light reflecting layer. The lower end is located below a middle of the light emitting element in a height direction of the light emitting element. The upper end is located above the middle of the light emitting element in the height direction of the light emitting element.

7 Claims, 15 Drawing Sheets

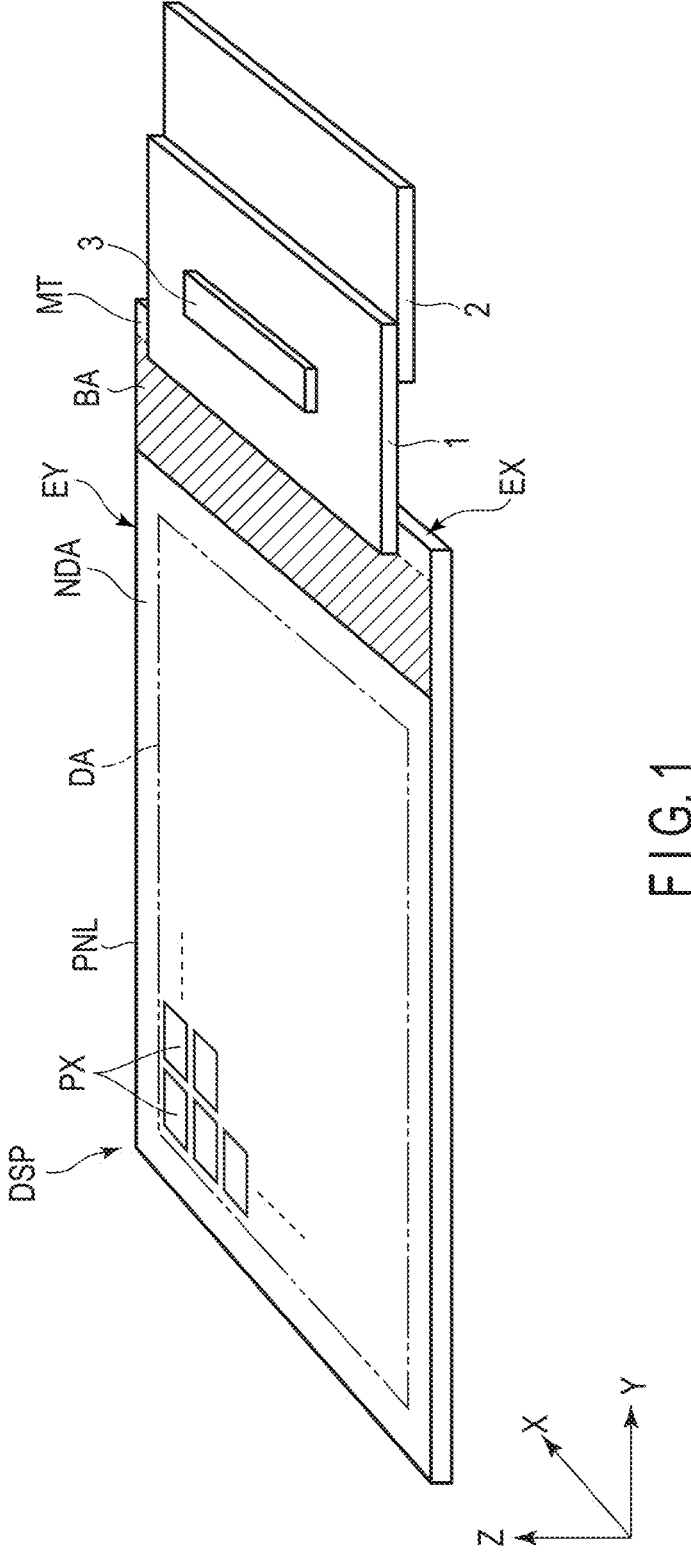
F I G. 1

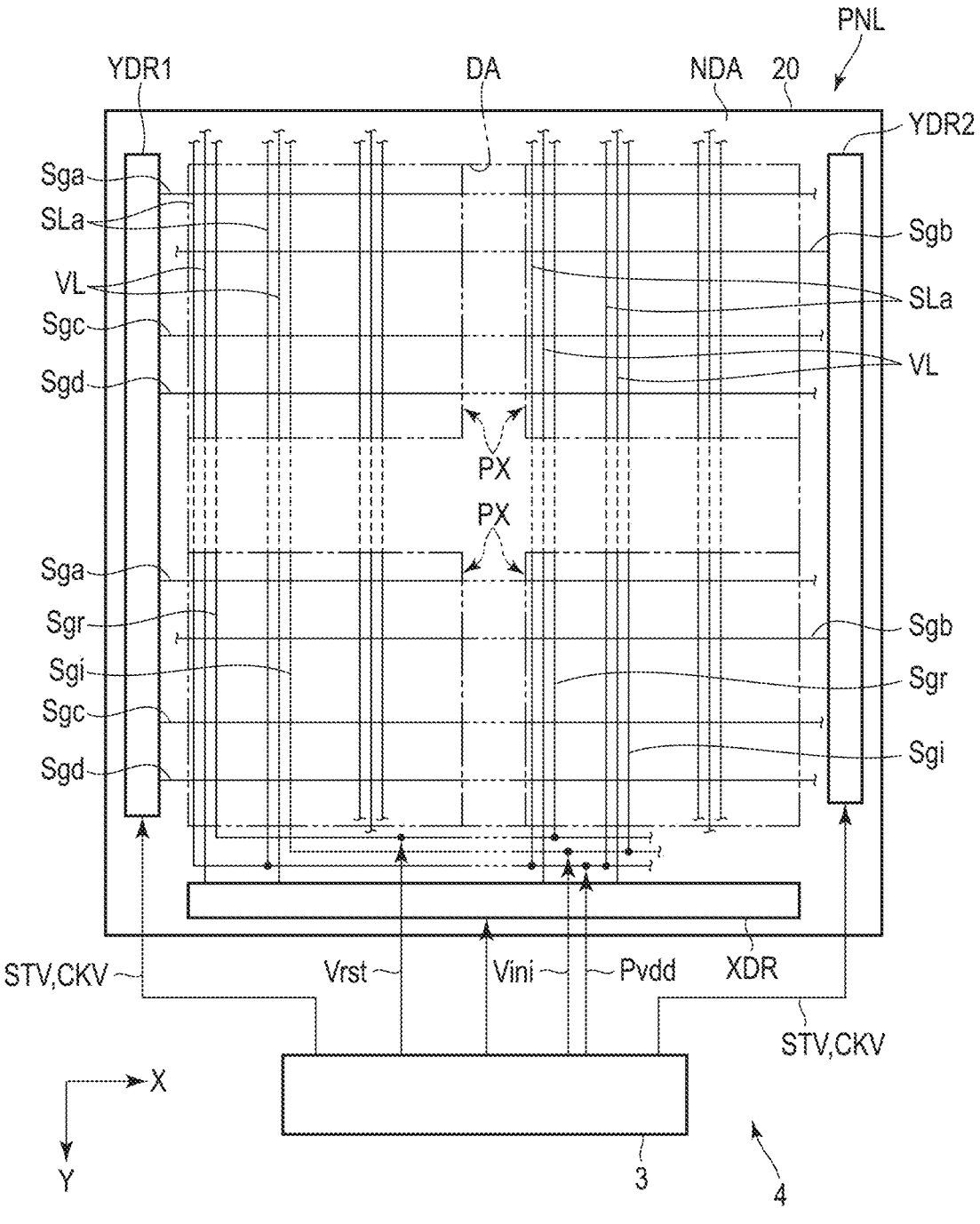
F I G. 2

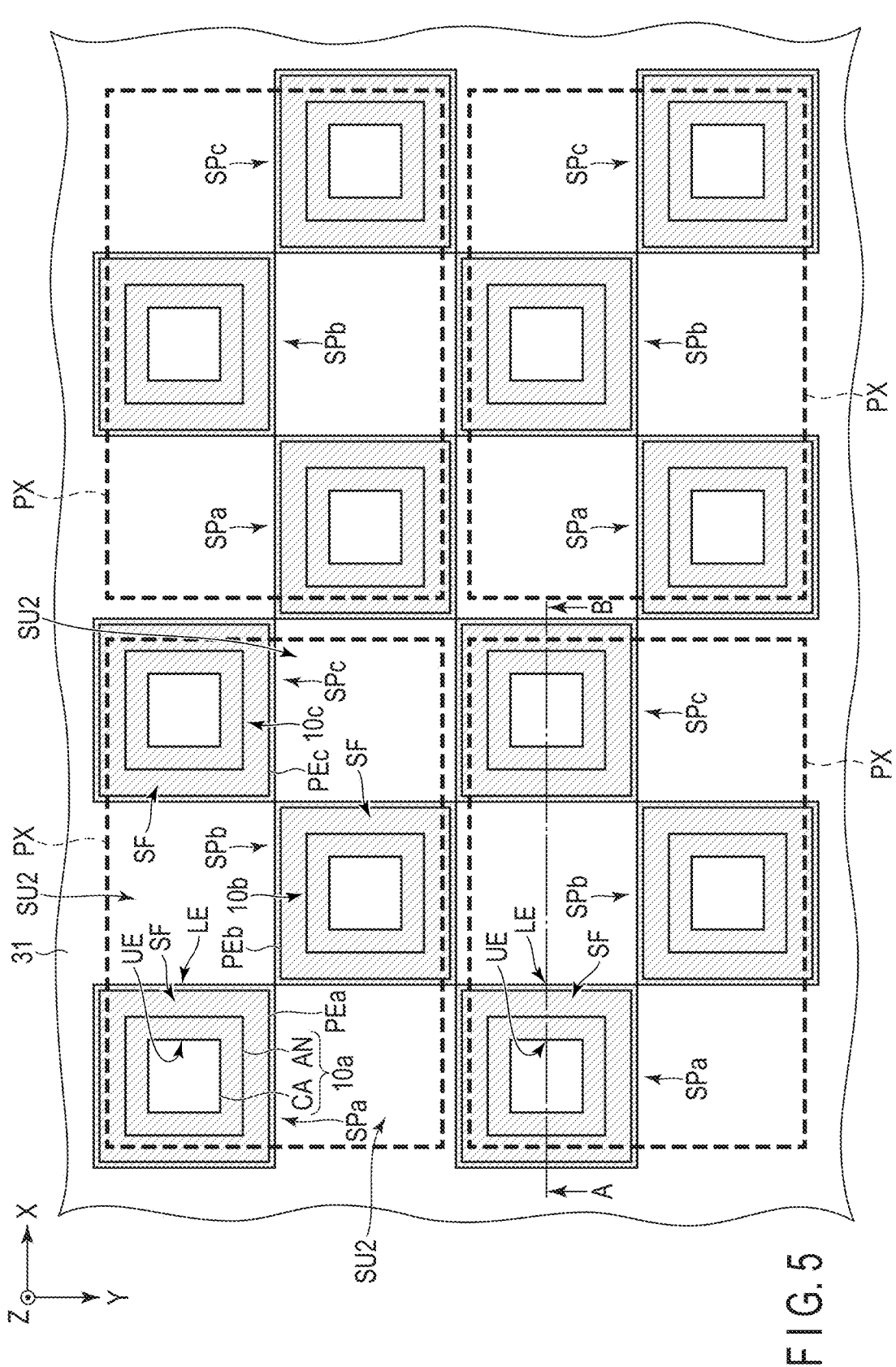
F I G . 5

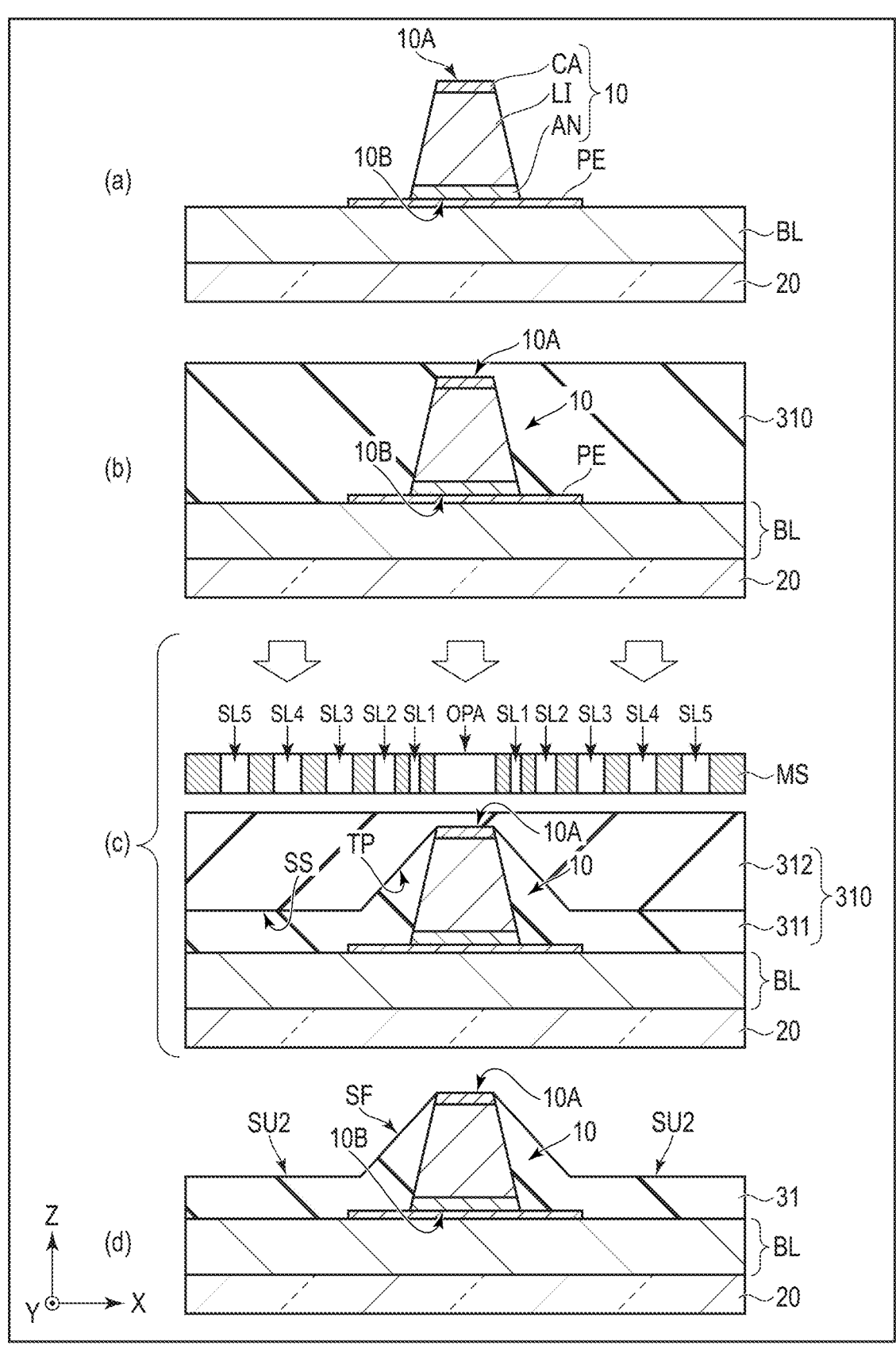
F I G. 7

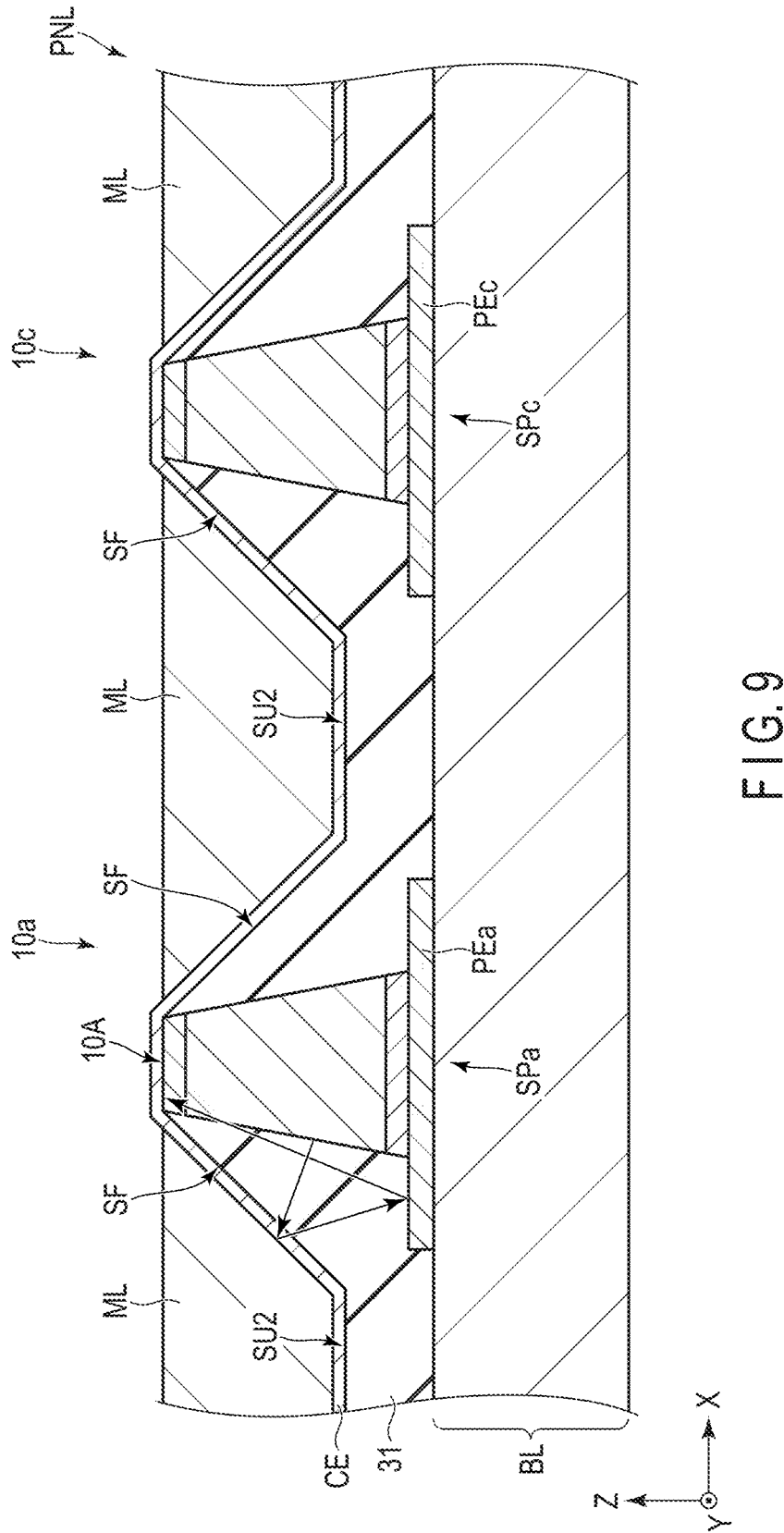
F I G. 9

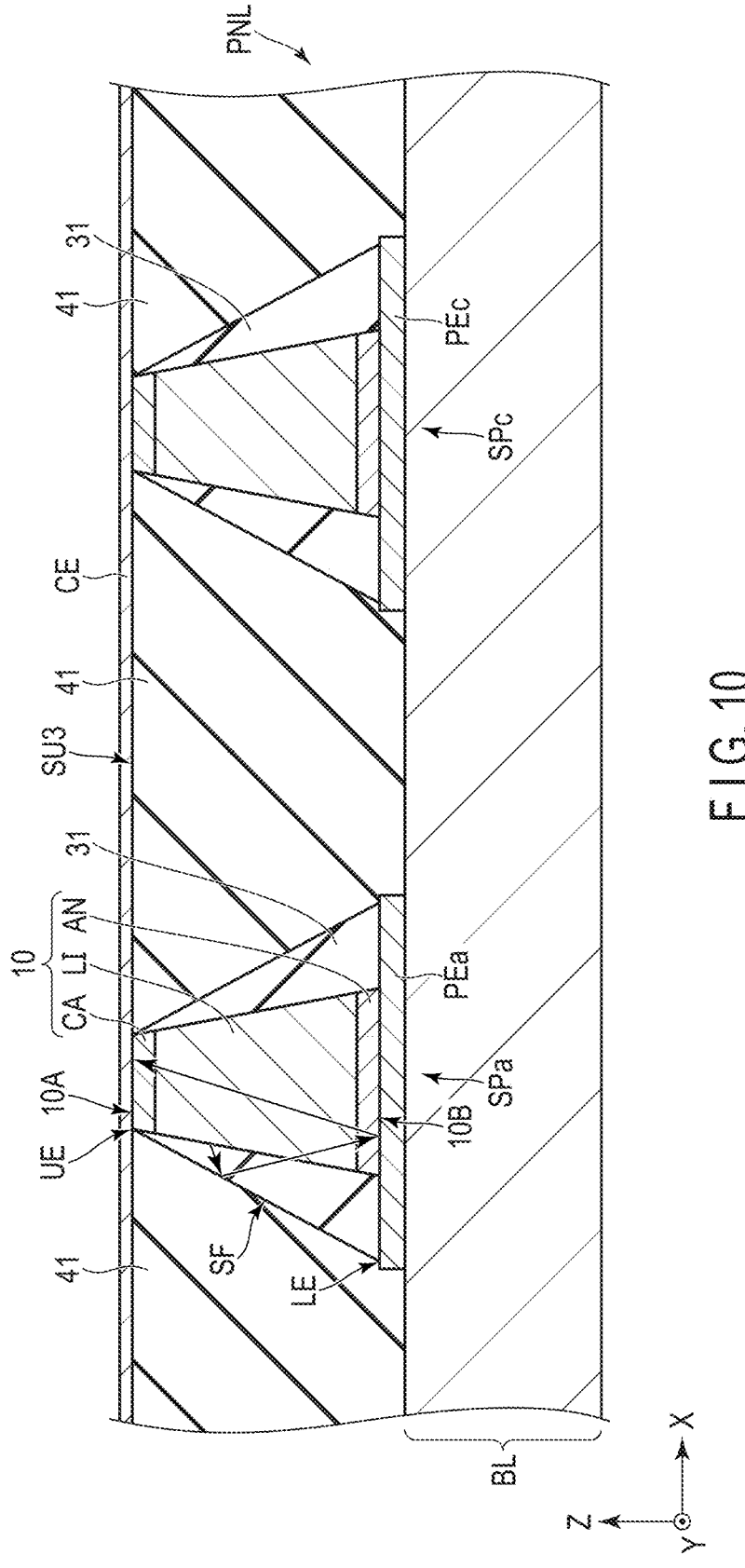
F I G. 10

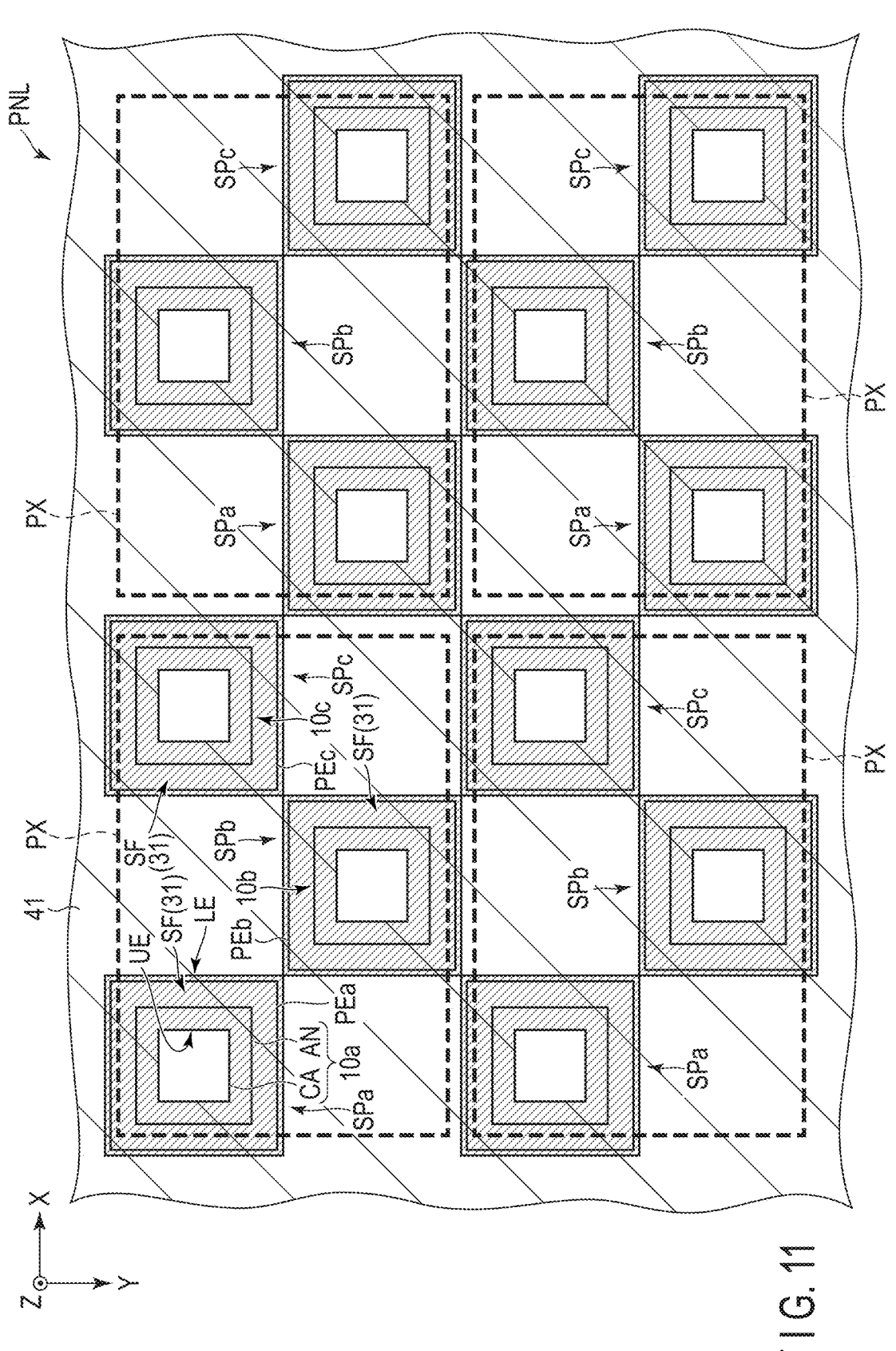
F I G. 11

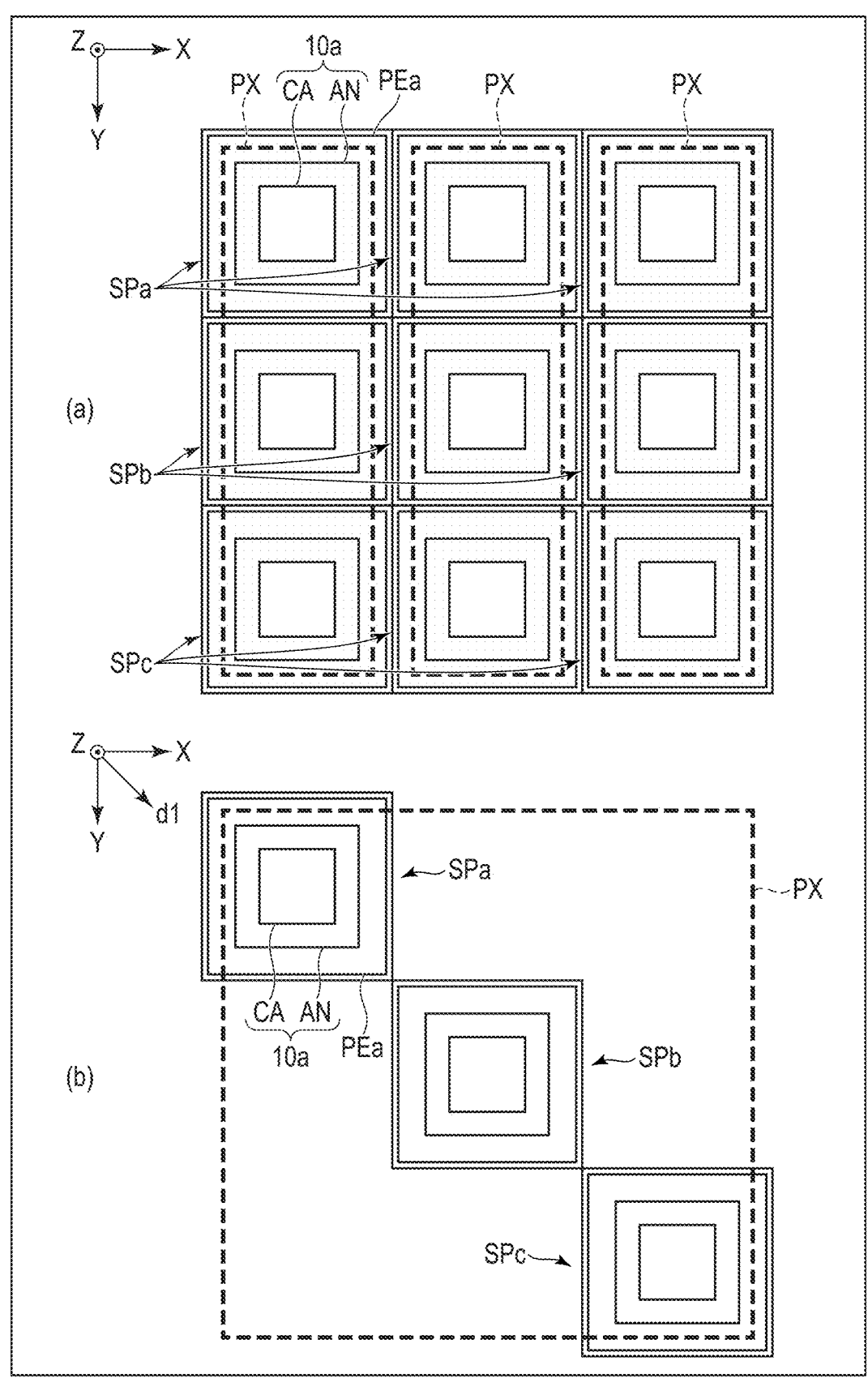
F I G. 13

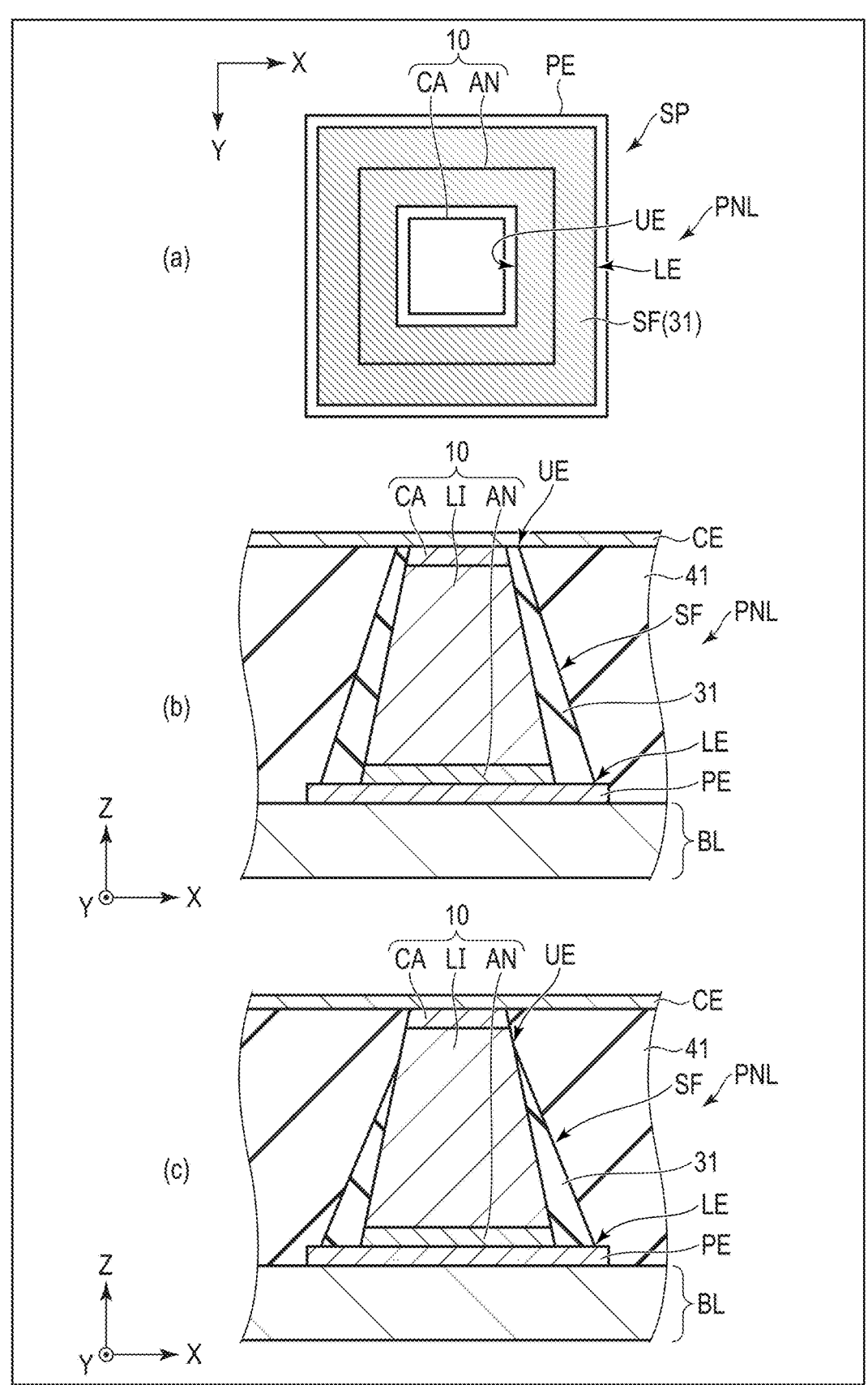
F I G. 14

DISPLAY DEVICE

CROSS-REFERENCE TO RELATED APPLICATIONS

This application is a Continuation Application of PCT Application No. PCT/JP2021/002304, filed Jan. 22, 2021 and based upon and claiming the benefit of priority from Japanese Patent Application No. 2020-066057, filed Apr. 1, 2020, the entire contents of all of which are incorporated herein by reference.

FIELD

Embodiments described herein relate generally to a display device.

BACKGROUND

As a display panel, an LED display panel using a light-emitting diode (LED) which is a spontaneous light-emitting element is known. In recent years, as a higher definition display panel, a display panel (hereinafter, referred to as a micro LED display panel) in which minute light-emitting diodes called micro LEDs are mounted on an array substrate has been developed.

Unlike a liquid crystal display or an organic EL display, a micro LED display is formed by mounting a large number of chip-shaped micro LEDs in a display area, and thus it is easy to achieve both high definition and large size, and is attracting attention as a next-generation display panel.

BRIEF DESCRIPTION OF THE DRAWINGS

FIG. 1 is a perspective view illustrating a configuration of a display device according to a first embodiment.

FIG. 2 is a circuit diagram illustrating the display device.

FIG. 5 is a plan view illustrating a layout of pixels illustrated in FIG. 1.

FIG. 7 is a cross-sectional view illustrating an example of manufacturing process of the display panel.

FIG. 9 is a cross-sectional view illustrating a display panel according to a modified example of the first embodiment.

FIG. 10 is a cross-sectional view illustrating a display panel of a second embodiment.

FIG. 11 is a plan view illustrating a pixel layout of the display panel illustrated in FIG. 10.

FIG. 13 is a plan view illustrating another example of the pixel layout of the display panel.

FIG. 14 is a cross-sectional view illustrating another example of the display panel of the second embodiment.

DETAILED DESCRIPTION

Figure 3:
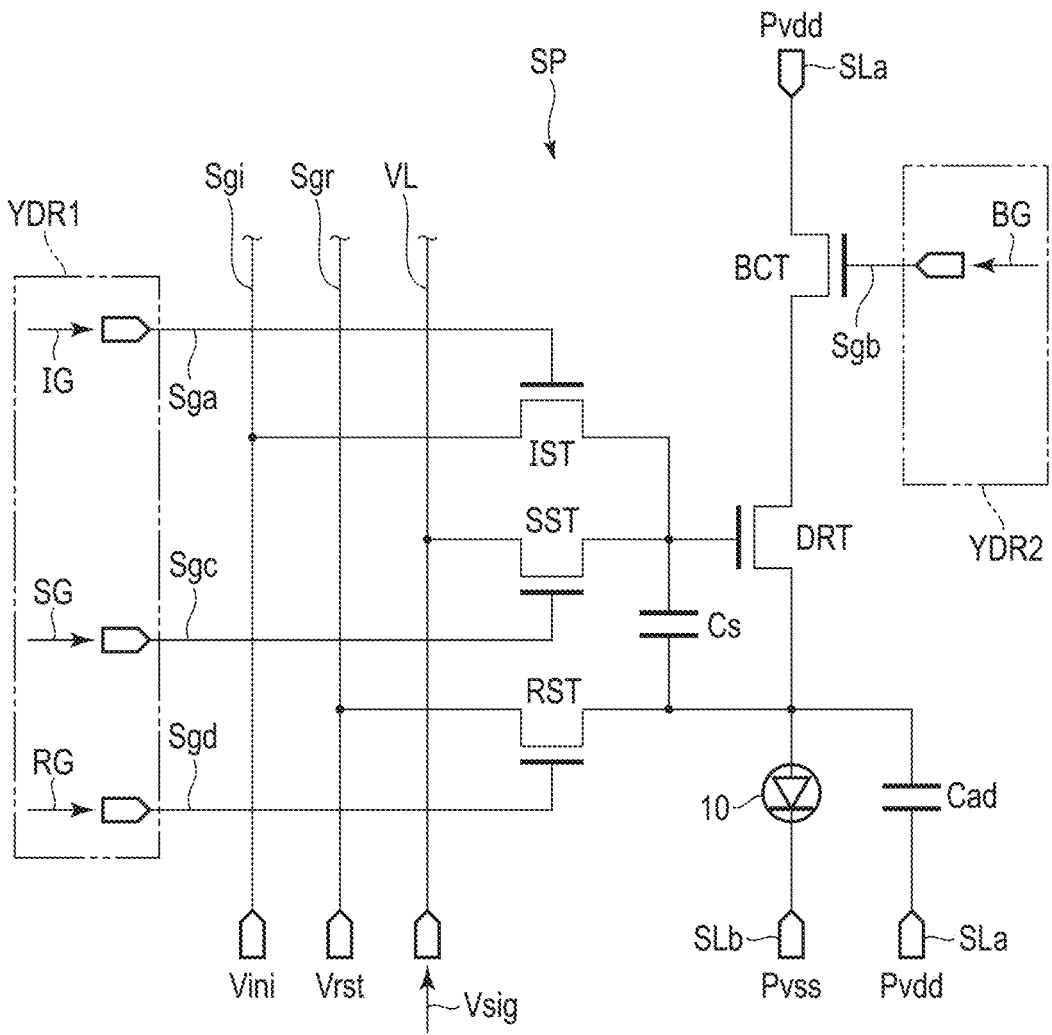
FIG. 3 is an equivalent circuit diagram illustrating a sub-pixel of the embodiment.

In general, according to one embodiment, there is provided a display device, comprising an organic insulating layer; a light reflecting layer located above the organic insulating layer; a light emitting element located above the light reflecting layer; a sealing layer located above the light reflecting layer and having an inclined surface having a lower end and an upper end closer to the light emitting element than the lower end; and a coating layer that is in contact with the inclined surface, an interface between the inclined surface and the coating layer being configured to reflect light traveling through the sealing layer toward the light reflecting layer, the lower end being located below a middle of the light emitting element in a height direction of the light emitting element, the upper end being located above the middle of the light emitting element in the height direction of the light emitting element.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

FIG. 1 is a perspective view schematically showing a configuration of a display device DSP according to a first embodiment. FIG. 1 shows a three-dimensional space defined by a first direction X, a second direction Y perpendicular to the first direction X and a third direction Z perpendicular to the first direction X and the second direction Y. Note that the first direction X and the second direction Y are orthogonal to each other, but they may intersect at an angle other than 90 degrees.

In the present embodiment, a direction in which an angle formed with the third direction Z is less than 45 degrees is defined as an upper side, a direction in which an angle formed with the first direction X is less than 45 degrees or a direction in which an angle formed with the second direction Y is less than 45 degrees is defined as a lateral side, and a direction in which an angle formed with the direction opposite to the third direction Z is less than 45 degrees is defined as a lower side. With such expressions "a second member above a first member" and "a second member below a first member", the second member may be in contact with the first member or may be remote from the first member.

Hereinafter, in the present embodiment, a case where the display device DSP is a micro LED display device using a micro light-emitting diode (hereinafter, referred to as a micro light emitting diode (LED)) which is a spontaneous light-emitting element will be mainly described.

As illustrated in FIG. 1, the display device DSP includes a display panel PNL, a first circuit substrate 1, a second circuit substrate 2, and the like.

For example, the display panel PNL has a rectangular shape. In the illustrated example, a shorter side EX of the display panel PNL is parallel to the first direction X, and a longer side EY of the display panel PNL is parallel to the second direction Y. The third direction Z corresponds to a thickness direction of the display panel PNL. The main surface of the display panel PNL is parallel to an X-Y plane defined by the first direction X and the second direction Y. The display panel PNL includes a display area DA and a non-display area NDA other than the display area DA. In the illustrated example, the non-display area NDA is an area outside the display area DA and surrounds the display area DA. The non-display area NDA has a terminal area MT.

The display area DA is an area for displaying an image, and a plurality of pixels PX are arranged in a matrix, for example, in the first direction X and the second direction Y in the display area DA. In the present embodiment, a shape of the display area DA is a quadrangle, but is not limited thereto, and may be a polygon other than the quadrangle, a circle, or the like. In addition, a size of the display area DA is larger than a size of the non-display area NDA, but is not limited thereto, and the size of the display area DA may be smaller than the size of the non-display area NDA.

The terminal area MT is provided along the shorter side EX of the display panel PNL, and includes a terminal for electrically connecting the display panel PNL to an external device or the like.

The first circuit substrate 1 is mounted on the terminal area MT and is electrically connected to the display panel PNL. The first circuit substrate 1 is, for example, a flexible printed circuit (FPC). The first circuit substrate 1 includes a driver IC chip (hereinafter, referred to as a panel driver) 3 that drives the display panel PNL. In the illustrated example, the panel driver 3 is mounted on the first circuit substrate 1, but may be mounted below the first circuit substrate 1. Alternatively, the panel driver 3 may be mounted on other than the first circuit substrate 1, for example, may be mounted on the display panel PNL or the second circuit substrate 2. The second circuit substrate 2 is, for example, a printed circuit board (PCB). The second circuit substrate 2 is connected to the first circuit substrate 1, for example, below the first circuit substrate 1.

The panel driver 3 is connected to a control substrate (not illustrated) via the second circuit substrate 2, for example. The panel driver 3 performs control to display an image on the display panel PNL by driving the plurality of pixels PX based on, for example, a video signal output from the control substrate.

The display panel PNL may have a bend area BA indicated by hatching. The bend area BA is an area that is bent when the display device DSP is accommodated in a housing. The bend area BA is located on the terminal area MT side of the non-display area NDA. In a state where the bend area BA is bent, the first circuit substrate 1 and the second circuit substrate 2 are disposed below the display panel PNL so as to face the display panel PNL.

FIG. 2 is a circuit diagram illustrating the display device DSP. FIG. 3 is an equivalent circuit diagram illustrating the sub-pixel SP of the present embodiment. In FIG. 2, not all the various wiring lines are illustrated.

As illustrated in FIGS. 2 and 3, the display panel PNL includes an insulating basement 20 having optical transparency, a plurality of pixels PX arranged in a matrix on the insulating basement 20 in the display area DA, various wiring lines, a scanning line driving circuit YDR1, a scanning line driving circuit YDR2, and a signal line driving circuit XDR.

The various wiring lines include a plurality of first scanning lines Sga, a plurality of second scanning lines Sgb, a plurality of third scanning lines Sgc, a plurality of fourth scanning lines Sgd, a plurality of video signal lines VL, a plurality of first power lines SLa, a plurality of reset wiring lines Sgr, and a plurality of initialization wiring lines Sgi.

In the present embodiment, the first scanning line Sga, the third scanning line Sgc, and the fourth scanning line Sgd are connected to the scanning line driving circuit YDR1 and provided to extend in the first direction X. The second scanning line Sgb is connected to the scanning line driving circuit YDR2 and is provided to extend in the first direction X. The video signal line VL is connected to the signal line driving circuit XDR, and is provided to extend in the second direction Y. The first power line SLa, the reset wiring line Sgr, and the initialization wiring line Sgi are provided to extend in the second direction Y.

For example, the plurality of first power lines SLa are located in the display area DA and arranged at intervals in the first direction X. The display panel PNL includes not only the first power line SLa but also the second power line SLb set to a potential different from that of the first power line SLa. In the present embodiment, the first power line SLa is a high potential power line fixed to a high potential Pvdd, and the second power line SLb is a low potential power line fixed to a low potential Pvss. The first power line SLa is connected to a high potential power supply, and the second power line SLb is connected to a low potential power supply.

The scanning line driving circuit YDR1 is configured to drive the first scanning line Sga, the third scanning line Sgc, and the fourth scanning line Sgd. The scanning line driving circuit YDR2 is configured to drive the second scanning line Sgb. The signal line driving circuit XDR is configured to drive the video signal line VL. The scanning line driving circuit YDR1, the scanning line driving circuit YDR2, and the signal line driving circuit XDR are formed on the insulating basement 20 in the non-display area NDA, and constitute a driver 4 together with the panel driver 3.

Each pixel PX includes a plurality of sub-pixels SP. Each sub-pixel SP includes a light emitting element 10 and a pixel circuit that applies a driving current to the light emitting element 10. The light emitting element 10 is, for example, a spontaneous light-emitting element, and is a micro light-emitting diode (hereinafter, referred to as a micro LED) in the present embodiment. The display device DSP of the present embodiment is a micro LED display device.

The pixel circuit of each sub-pixel SP is a voltage signal type pixel circuit that controls light emission of the light emitting element 10 according to a video signal Vsig consisting of a voltage signal, and includes a reset switch RST, a pixel switch SST, an initialization switch IST, an output switch BCT, a drive transistor DRT, a storage capacitor Cs, and an auxiliary capacitor Cad. The storage capacitor Cs and the auxiliary capacitor Cad are capacitors. The auxiliary capacitor Cad is an element provided to adjust an amount of light emission current, and may be unnecessary in some cases.

The reset switch RST, the pixel switch SST, the initialization switch IST, the output switch BCT, and the drive transistor DRT are constituted by thin-film transistors (TFTs). In the present embodiment, the reset switch RST, the pixel switch SST, the initialization switch IST, the output switch BCT, and the drive transistor DRT are constituted by TFTs of the same conductivity type, for example, N-channel type. Note that one or more of the reset switch RST, the pixel switch SST, the initialization switch IST, the output switch BCT, and the drive transistor DRT may be constituted by P-channel type TFTs. In that case, the N-channel type TFT and the P-channel type TFT may be formed simultaneously. The reset switch RST, the pixel switch SST, the initialization switch IST, and the output switch BCT only need to function as switches, and may not be constituted by TFTs.

In the display device DSP according to the present embodiment, all the TFTs constituting the drive transistor DRT and each switch are formed in the same step and in the same layer structure, and are thin-film transistors having a top-gate structure using polycrystalline silicon for a semiconductor layer. As the semiconductor layer, a semiconductor other than polycrystalline silicon, such as amorphous silicon or an oxide semiconductor, may be used.

The reset switch RST, the pixel switch SST, the initialization switch IST, the output switch BCT, and the drive transistor DRT each have a first terminal, a second terminal, and a control terminal. In the present embodiment, the first terminal is a source electrode, the second terminal is a drain electrode, and the control terminal is a gate electrode.

In the pixel circuit of the pixel PX, the drive transistor DRT and the output switch BCT are connected in series with the light emitting element 10 between the first power line SLa and the second power line SLb. The first power line SLa (high potential Pvdd) is set to, for example, a potential of 10 V, and the second power line SLb (low potential Pvss) is set to, for example, a potential of 1.5 V.

In the output switch BCT, the drain electrode is connected to the first power line SLa, the source electrode is connected to the drain electrode of the drive transistor DRT, and the gate electrode is connected to the second scanning line Sgb. As a result, the output switch BCT is controlled to be turned on (conductive state) or off (non-conductive state) by a control signal BG provided to the second scanning line Sgb. The output switch BCT controls light emission time of the light emitting element 10 in response to the control signal BG.

In the drive transistor DRT, the drain electrode is connected to the source electrode of the output switch BCT, and the source electrode is connected to one electrode (here, an anode) of the light emitting element 10. The other electrode (here, a cathode) of the light emitting element 10 is connected to the second power line SLb. The drive transistor DRT outputs a driving current of a current amount corresponding to the video signal Vsig to the light emitting element 10.

In the pixel switch SST, the source electrode is connected to the video signal line VL, the drain electrode is connected to the gate electrode of the drive transistor DRT, and the gate electrode is connected to the third scanning line Sgc functioning as a signal writing control gate wiring line. The pixel switch SST is controlled to be turned on and off by a control signal SG supplied from the third scanning line Sgc. Then, in response to the control signal SG, the pixel switch SST controls connection and disconnection between the pixel circuit and the video signal line VL, and fetches the video signal Vsig from the video signal line VL into the pixel circuit.

In the initialization switch IST, the source electrode is connected to the initialization wiring line Sgi, the drain electrode is connected to the gate electrode of the drive transistor DRT, and the gate electrode is connected to the first scanning line Sga. The initialization switch IST is controlled to be turned on and off by a control signal IG supplied from the first scanning line Sga. Then, the initialization switch IST controls connection and disconnection between the pixel circuit and the initialization wiring line Sgi in response to the control signal IG. By connecting the pixel circuit and the initialization wiring line Sgi by the initialization switch IST, an initializing potential (initialization voltage) Vini can be fetched from the initialization wiring line Sgi into the pixel circuit.

The reset switch RST is connected between the source electrode of the drive transistor DRT and the reset wiring line Sgr. A gate electrode of the reset switch RST is connected to a fourth scanning line Sgd functioning as a reset control gate wiring line. As described above, the reset wiring line Sgr is connected to a reset power supply and is fixed to a reset potential Vrst which is a constant potential. The reset switch RST is switched to a conductive state (ON) or a non-conductive state (OFF) according to a control signal RG provided through the fourth scanning line Sgd. By switching the reset switch RST to the ON state, the potential of the source electrode of the drive transistor DRT can be reset to the reset potential Vrst.

The storage capacitor Cs is connected between the gate electrode and the source electrode of the drive transistor DRT. The auxiliary capacitor Cad is connected between the source electrode of the drive transistor DRT and the first power line SLa as a constant potential wiring line.

On the other hand, the panel driver 3 illustrated in FIG. 2 controls the scanning line driving circuit YDR1, the scanning line driving circuit YDR2, and the signal line driving circuit XDR. The panel driver 3 receives a digital video signal and a synchronization signal supplied from the outside, and generates a vertical scanning control signal for controlling a vertical scanning timing and a horizontal scanning control signal for controlling a horizontal scanning timing based on the synchronization signal.

Then, the panel driver 3 supplies the vertical scanning control signal and the horizontal scanning control signal to the scanning line driving circuit YDR1, the scanning line driving circuit YDR2, and the signal line driving circuit XDR, respectively, and supplies the digital video signal and the initialization signal to the signal line driving circuit XDR in synchronization with the horizontal and vertical scanning timings.

The signal line driving circuit XDR converts the video signal sequentially obtained in each horizontal scanning period into an analog format by the control of the horizontal scanning control signal, and supplies the video signal Vsig corresponding to the gradation to the plurality of video signal lines VL. The panel driver 3 fixes the first power line SLa to the high potential Pvdd, fixes the reset wiring line Sgr to the reset potential Vrst, and fixes the initialization wiring line Sgi to the initializing potential Vini. Note that the potential of the first power line SLa, the potential of the reset wiring line Sgr, and the potential of the initialization wiring line Sgi may be set via the signal line driving circuit XDR.

A start pulse signal STV, a clock signal CKV, and the like are supplied from the panel driver 3 to the scanning line driving circuit YDR1 and the scanning line driving circuit YDR2.

The scanning line driving circuit YDR1 and the scanning line driving circuit YDR2 include a shift register, an output buffer, and the like (not illustrated), sequentially transfer the start pulse signal STV to the shift register of the next stage, and supply four types of control signals, that is, the control signals IG, BG, SG, and RG to the sub-pixels SP of each row via the output buffer. As a result, the first scanning line Sga, the second scanning line Sgb, the third scanning line Sgc, and the fourth scanning line Sgd are driven by the control signals IG, BG, SG, and RG, respectively.

Note that the circuit configuration of the sub-pixel SP described in FIG. 3 is an example, and the circuit configuration of the sub-pixel SP may be another configuration as long as the sub-pixel includes at least the drive transistor DRT and the light emitting element 10. For example, some elements of the circuit configuration of the sub-pixel SP described in FIG. 3 may be omitted, or other elements may be added.

Next, structures of the drive transistor DRT, the reset switch RST, the pixel electrode PE, the light emitting element 10, the second power line SLb, the common electrode CE, and the like will be described with reference to FIG. 4.

Figure 4:
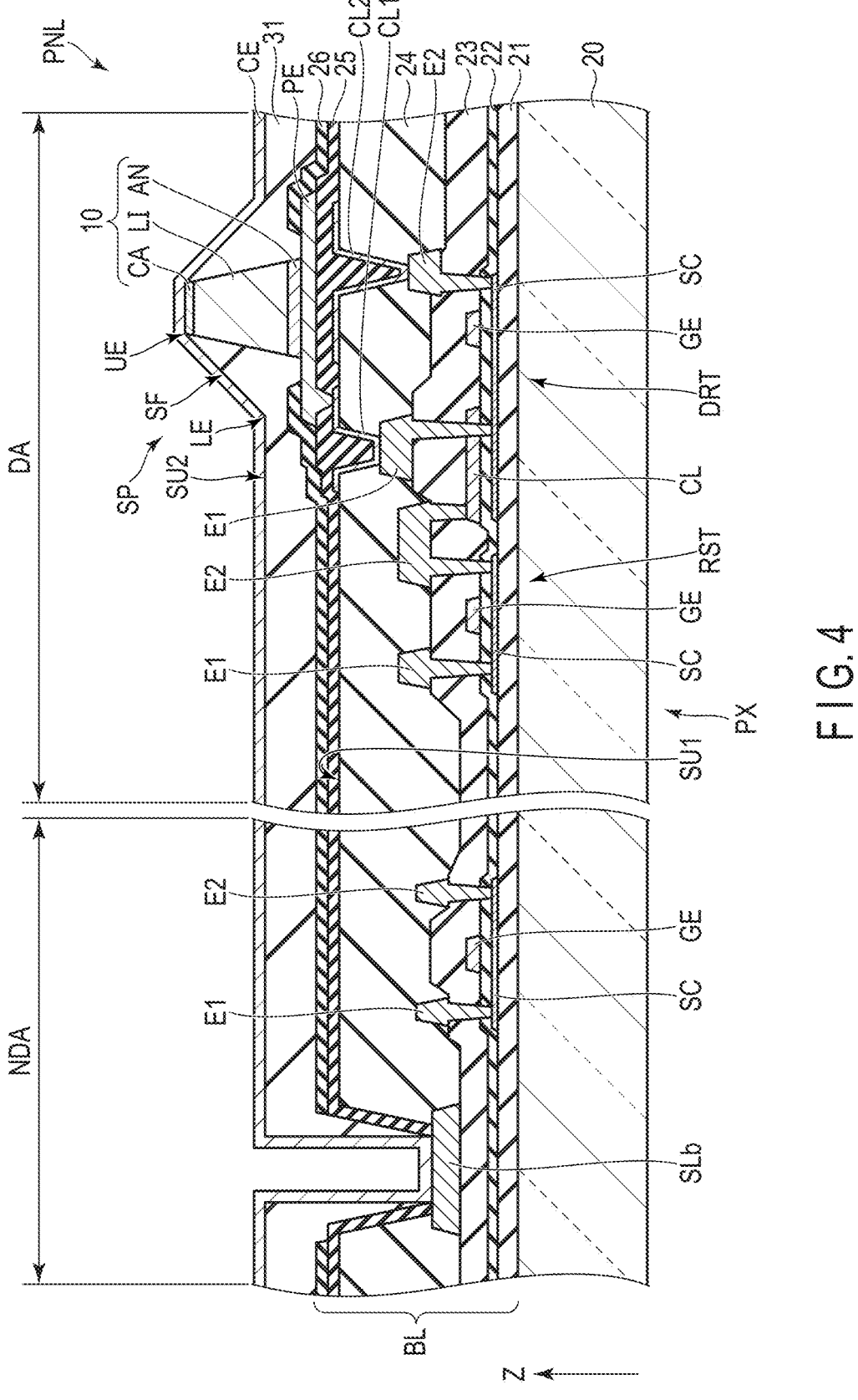
FIG. 4 is a partial cross-sectional view illustrating a display panel illustrated in FIG. 1.

FIG. 4 is a partial cross-sectional view illustrating the display panel PNL illustrated in FIG. 1. In FIG. 4, the display panel PNL is drawn such that the display surface, that is, a light emission surface faces upward and the back surface faces downward.

As illustrated in FIG. 4, the display panel PNL includes an insulating basement 20, insulating layers 21, 22, 23, 24, 25, and 26 provided on the insulating basement 20, and a plurality of pixels PX. The plurality of pixels PX are provided on the insulating basement 20, are located in the display area DA, and include sub-pixels SP of a plurality of colors.

As the insulating basement 20, a glass substrate such as quartz or alkali-free glass, or a resin substrate such as polyimide can be mainly used. The material of the insulating basement 20 may be any material that can withstand the processing temperature at the time of manufacturing the TFT. When the insulating basement 20 is a flexible resin substrate, the display device DSP can be configured as a sheet display. The resin substrate is not limited to polyimide, and other resin materials may be used. When polyimide or the like is used for the insulating basement 20, the insulating basement 20 may be appropriately referred to as an organic insulating layer or a resin layer.

The insulating layer 21 is provided on the insulating basement 20. Various TFTs are formed on the insulating layer 21. In the display area DA, the drive transistor DRT, the reset switch RST, and the like are formed on the insulating layer 21. In the non-display area NDA, TFTs and the like constituting the scanning line driving circuit YDR are formed on the insulating layer 21. The TFT such as the drive transistor DRT includes a semiconductor layer SC, a gate electrode GE, a first electrode E1, and a second electrode E2.

The semiconductor layer SC is disposed on insulating layer 21. The insulating layer 22 is provided on the insulating layer 21 and the semiconductor layer SC. The gate electrode GE is disposed on the insulating layer 22 and faces the channel region of the semiconductor layer SC. The insulating layer 23 is provided on the insulating layer 22 and the gate electrode GE. The first electrode E1 and the second electrode E2 are disposed on the insulating layer 23. The first electrode E1 and the second electrode E2 are electrically connected to the corresponding semiconductor layer SC through contact holes formed in the insulating layer 22 and the insulating layer 23, respectively.

The conductive layer CL is formed on the insulating layer 22. The first electrode E1 of the drive transistor DRT is electrically connected not only to the corresponding semiconductor layer SC but also to the conductive layer CL. The second electrode E2 of the reset switch RST is electrically connected not only to the corresponding semiconductor layer SC but also to the conductive layer CL. Therefore, the drive transistor DRT and the reset switch RST are electrically connected via the conductive layer CL.

In the non-display area NDA, the second power line SLb is disposed on the insulating layer 23. The insulating layer 24 is provided on the insulating layer 23, the first electrode E1, the second electrode E2, and the second power line SLb.

The first conductive layer CL1 and the second conductive layer CL2 are disposed on the insulating layer 24. The first conductive layer CL1 is electrically connected to the first electrode E1 through a contact hole formed in the insulating layer 24. The second conductive layer CL2 is electrically connected to the second electrode E2 through a contact hole formed in the insulating layer 24.

The insulating layer 25 is provided on the insulating layer 24, the first conductive layer CL1, and the second conductive layer CL2. The pixel electrode PE is disposed on the insulating layer 25 and is located above a flat surface SU1. The pixel electrode PE is electrically connected to the first conductive layer CL1 through a contact hole CH formed in the insulating layer 25. The pixel electrode PE is electrically connected to the drive transistor DRT, and is supplied with a signal whose current value is controlled from the drive transistor DRT. The pixel electrode PE is a pad on which a light emitting element 10 to be described later is mounted, and may be referred to as an anode pad on which an anode AN of the light emitting element 10 is mounted.

The insulating layer 26 is provided on the insulating layer 25 and the pixel electrode PE. Although not illustrated, the insulating layer 26 is located on the plurality of pixel electrodes PE and covers the plurality of pixel electrodes PE. The insulating layer 26 has an opening for mounting the light emitting element 10 on a part of the surface of the pixel electrode PE. The size of the opening of the insulating layer 26 is slightly larger than that of the light emitting element 10 in consideration of the mounting deviation amount and the like in the mounting process of the light emitting element 10. For example, in a case where the light emitting element 10 has a mounting area of substantially 4 μm×4 μm to a mounting area of 5 μm×5 μm, it is preferable that the opening is substantially secured to 8 μm×8 μm to 10 μm×10 μm.

As described above, a base layer BL having a laminated structure from the insulating layer 21 to the insulating layer 26 is provided on the insulating basement 20. The base layer BL includes, for example, a plurality of pixel electrodes PE.

Here, the insulating layers 21, 22, 23, 24, 25, and 26 are formed of an inorganic insulating material or an organic insulating material. In the present embodiment, the insulating layers 21, 22, 23, 25, and 26 are formed of, for example, silicon oxide (SiO2) or silicon nitride (SiN) as an inorganic insulating material.

The insulating layer 24 is formed of, for example, a photosensitive acrylic resin as a resin material. The insulating layer 24 has the flat surface SU1 on the side opposite to the side facing the insulating layer 23. Therefore, the insulating layer 24 is a planarized organic insulating layer.

The semiconductor layer SC is formed of low temperature polycrystalline silicon as polycrystalline silicon. However, the semiconductor layer SC may be formed of a semiconductor other than polycrystalline silicon, such as amorphous silicon or an oxide semiconductor. The gate electrode GE and the conductive layer CL are located in the same layer, and are formed of metal as the same conductive material. For example, the gate electrode GE and the conductive layer CL are made of molybdenum-tungsten (MoW).

The first electrode E1, the second electrode E2, and the second power line SLb are located in the same layer, and are formed of metal as the same conductive material. For example, each of the first electrode E1, the second electrode E2, and the second power line SLb adopts a three-layer laminated structure (Ti-based/Al-based/Ti-based), and includes a lower layer made of a metal material containing Ti (titanium) as a main component, such as Ti and an alloy containing Ti, a middle layer made of a metal material containing Al (aluminum) as a main component, such as Al and an alloy containing Al, and an upper layer made of a metal material containing Ti as a main component, such as Ti and an alloy containing Ti. Here, the top-gate type TFT is described as an example, but the TFT may be a bottom-gate type TFT.

A switch such as the drive transistor DRT is covered with the insulating layer 24.

The first conductive layer CL1 and the second conductive layer CL2 are located in the same layer, and are formed of a metal or a transparent conductive material as the same conductive material. The pixel electrode PE is made of metal as a conductive material. For example, the pixel electrode PE has a single conductive layer, a three-layer laminated structure, or a two-layer laminated structure.

In the three-layer laminated structure, the pixel electrode PE is not limited to the Ti-based/Al-based/Ti-based structure, and may be a Mo-based/Al-based/Mo-based structure. In the Mo-based/Al-based/Mo-based structure, the pixel electrode PE includes a lower layer made of a metal material containing Mo (molybdenum) as a main component, such as Mo and an alloy containing Mo, a middle layer made of a metal material containing Al as a main component, such as Al and an alloy containing Al, and an upper layer made of a metal material containing Mo as a main component, such as Mo and an alloy containing Mo.

In the two-layer laminated structure, the pixel electrode PE has a lower layer made of a metal material containing Al as a main component and an upper layer made of a metal material containing Ti as a main component. Alternatively, the pixel electrode PE has a lower layer made of a metal material containing Ti as a main component and an upper layer made of a metal material containing Al as a main component. Furthermore, the pixel electrode PE may have a lower layer made of a metal material containing Mo as a main component and an upper layer made of a metal material containing Al as a main component. The pixel electrode PE may be formed of a transparent conductive material.

In the display area DA, a plurality of light emitting elements 10 are mounted on the base layer BL. Specifically, the light emitting element 10 is mounted on the pixel electrode PE. The light emitting element 10 includes an anode AN as a first electrode, a cathode CA as a second electrode, and a light emitting layer LI that emits light. As the light emitting element 10, light emitting elements having emission colors of a first color, a second color, and a third color are prepared, and the anode AN is electrically connected to and fixed to the corresponding pixel electrode PE. In the present embodiment, the first color is red (R), the second color is green (G), and the third color is blue (B).

The joint between the anode AN of the light emitting element 10 and the pixel electrode PE is not particularly limited as long as good conduction can be secured between the anode AN and the pixel electrode PE, and the laminated structure from the insulating basement 20 to the insulating layer 26 is not damaged. For example, a reflow step using a low-temperature melting solder material, a method of placing the light emitting element 10 on the pixel electrode PE via a conductive paste and then sintering, or a method of solid-state welding such as ultrasonic welding using a similar material for the surface of the pixel electrode PE and the anode AN of the light emitting element 10 can be adopted. The light emitting element 10 has a cathode CA on the opposite side of the anode AN electrically connected to the pixel electrode PE.

A sealing layer 31 is provided on the base layer BL on which the light emitting element 10 is mounted. A void portion between the plurality of light emitting elements 10 is filled with the sealing layer 31. The sealing layer 31 has an inclined surface SF and a flat surface SU2 on the side opposite to the side facing the base layer BL. The inclined surface SF has an upper end UE and a lower end LE. The upper end UE is closer to the light emitting element 10 than the lower end LE. The sealing layer 31 exposes the surface of the cathode CA of the light emitting element 10.

The common electrode CE is located at least in the display area DA. The common electrode CE is located above the pixel electrode PE. The common electrode CE is disposed on the sealing layer 31 and the plurality of light emitting elements 10, and covers the light emitting elements 10 and the sealing layer 31 of the plurality of pixels. The common electrode CE is in contact with the plurality of cathodes CA and is electrically connected to the plurality of cathodes CA. The common electrode CE is shared by the plurality of sub-pixels SP. The common electrode CE may also be referred to as a cathode electrode.

The common electrode CE extends to the non-display area NDA, and is electrically connected to the second power line SLb in the non-display area NDA. The common electrode CE is in contact with the second power line SLb through contact holes formed in the sealing layer 31, the insulating layer 26, the insulating layer 25, and the insulating layer 24. Therefore, the common electrode CE is held at the same constant potential as the potential of the second power line SLb, and electrically connects the second power line SLb and the cathodes CA of all the light emitting elements 10.

The common electrode CE needs to be formed as a transparent electrode in order to extract light emitted from the light emitting element 10, and is formed using, for example, indium tin oxide (ITO) as a transparent conductive material. A part of the unevenness due to the mounting of the light emitting element 10 remains on the surface on which the common electrode CE is formed, but it is sufficient that the material forming the common electrode CE can be continuously covered without disconnection.

Next, the layout of the pixel PX will be described.

FIG. 5 is a plan view illustrating a layout of the pixel PX illustrated in FIG. 1, and is a view illustrating the light emitting element 10, the pixel electrode PE, and the sealing layer 31. The inclined surface SF of the sealing layer 31 is hatched.

As illustrated in FIG. 5, each pixel PX includes a plurality of sub-pixels SP. In the present embodiment, each pixel PX includes sub-pixels SP of three colors of a sub-pixel SPa of a first color, a sub-pixel SPb of a second color, and a sub-pixel SPc of a third color.

In the illustrated example, the sub-pixel SP and the sub-pixel SP are arranged in a checkered pattern for every other sub-pixel SP. The sub-pixel SPa, the sub-pixel SPc, and the sub-pixel SPb are arranged in this order in the first direction X. The plurality of sub-pixels SPa are arranged in the second direction Y, the plurality of sub-pixels SPb are arranged in the second direction Y, and the plurality of sub-pixels SPc are arranged in the second direction Y. In the pixel PX, the sub-pixel SPa is adjacent to the sub-pixel SPc at a distance in the first direction X, and the sub-pixel SPb is located between the sub-pixel SPa and the sub-pixel SPc in the first direction X.

The sub-pixel SPa includes a light emitting element 10a and a pixel electrode PEa, the sub-pixel SPb includes a light emitting element 10b and a pixel electrode PEb, and the sub-pixel SPc includes a light emitting element 10c and a pixel electrode PEc. The light emitting element 10a is mounted on the pixel electrode PEa, the light emitting element 10b is mounted on the pixel electrode PEb, and the light emitting element 10c is mounted on the pixel electrode PEc.

Here, attention is paid to the positional relationship between the sub-pixel SPa and the sealing layer 31. In plan view, the cathode CA is located inside the anode AN, and the anode AN is located inside the pixel electrode PEa. The sealing layer 31 overlaps the anode AN and the pixel electrode PEa, and does not overlap the cathode CA. The inclined surface SF is provided so as to surround the light emitting element 10. The inclined surface SF is located between the cathode CA and the pixel electrode PEa in plan view, overlaps the pixel electrode PEa, and extends outside the pixel electrode PEa. The upper end UE matches the outer shape of the cathode CA. Note that the upper end UE may not match the outer shape of the cathode CA. The lower end LE is located outside the pixel electrode PEa and is provided so as to surround the pixel electrode PEa. The lower end LE may be located inside the pixel electrode PEa. The flat surface SU2 is connected to the lower end LE of each inclined surface SF. In the illustrated example, the upper end UE and the lower end LE are located on the same straight line along the first direction X.

Figure 6:
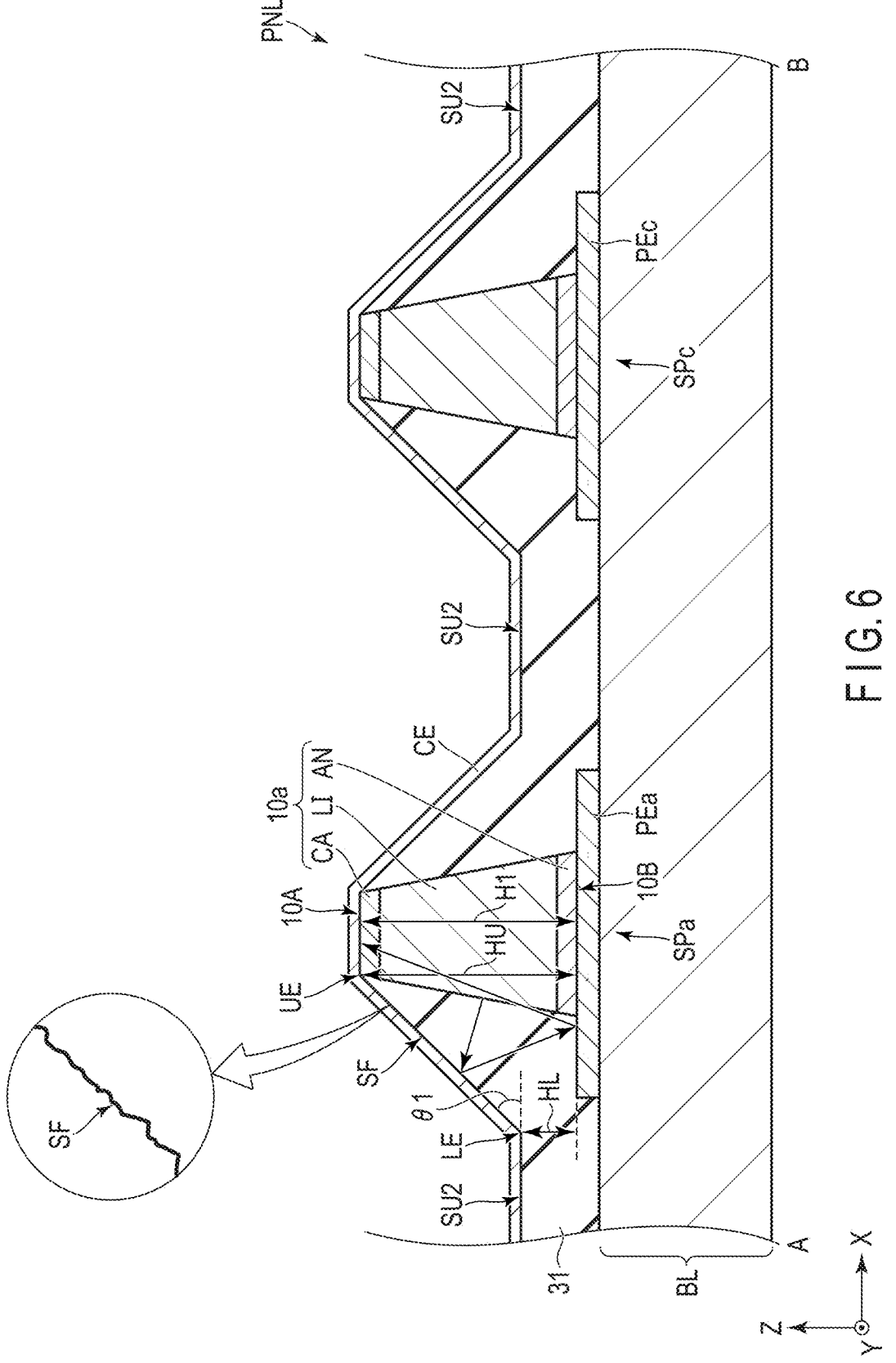
FIG. 6 is a cross-sectional view illustrating the display panel taken along line A-B in FIG. 5.

FIG. 6 is a cross-sectional view illustrating the display panel PNL along line A-B in FIG. 5. The base layer BL, the pixel electrode PE, the light emitting element 10, the common electrode CE, and the sealing layer 31 are illustrated, and illustration of a laminated structure from the insulating basement 20 to the insulating layer 26 is omitted.

The sealing layer 31 is located between the pixel electrode PEa and the common electrode CE. The light emitting element 10a is located between the pixel electrode PEa and the common electrode CE, and has an upper surface 10A, a lower surface 10B, and a height H1. In the present embodiment, the upper surface 10A corresponds to a surface connected to the common electrode CE of the cathode CA, and the lower surface 10B corresponds to a surface connected to the pixel electrode PEa of the anode AN. In the height direction (the third direction Z) of the light emitting element 10, the upper end UE is located above the middle of the light emitting element 10, and the lower end LE is located below the middle of the light emitting element 10. The height H1 corresponds to a length from the lower surface 10B to the upper surface 10A in the third direction Z. The upper end UE is located at a height HU, and the lower end LE is located at a height HL. The height HU corresponds to a length from the lower surface 10B to the upper end UE in the third direction Z. The height HL corresponds to a length from an extended surface of the lower surface 10B to the lower end LE in the third direction Z. In the illustrated example, the height HL is less than half the height H1, and the height HU is the same height as the height H1. Note that the height HU may be a height equal to or more than half of the height H1, and the height HL may be a height less than half of the height H1.

As illustrated in an enlarged manner in FIG. 6, the inclined surface SF is a surface having an uneven shape. Note that the inclined surface SF may be a flat surface. The inclined surface SF is an interface between the sealing layer 31 and the common electrode CE. In the illustrated example, the common electrode CE covers the entire sealing layer 31, but may only cover the light emitting element 10 and the inclined surface SF. In the illustrated example, the upper end UE and the lower end LE are located on the same X-Z plane.

The inclined surface SF has an angle θ1. The angle θ1 is an angle formed by an extension line of the flat surface SU2 (a line toward the light emitting element 10 closest to the flat surface SU2) and an imaginary straight line connecting the lower end LE and the upper end UE. The angle θ1 is an acute angle, and is preferably 20 degrees or more and 50 degrees or less. More preferably, the angle θ1 is 45 degrees.

The sealing layer 31 has a refractive index n31. The common electrode CE has a refractive index nCE larger than the refractive index n31 of the sealing layer 31. For example, the refractive index n31 is approximately 1.6 and the refractive index nCE is approximately 1.9. The inclined surface SF of the sealing layer 31 is an interface of layers having different refractive indexes, and reflects light traveling to the inclined surface SF toward the pixel electrode PEa.

According to the present embodiment, among the light emitted from the light emitting layer LI, the light traveling toward the inclined surface SF is reflected by the inclined surface SF which is an interface of layers having different refractive indexes. Among the light reflected by the inclined surface SF, the light traveling toward the pixel electrode PEa is reflected by the pixel electrode PEa. The light reflected by the pixel electrode PEa travels toward the upper surface 10A. Among the light emitted from the light emitting layer LI, light traveling in the lateral direction is reflected by the inclined surface SF and the pixel electrode PEa, and becomes light traveling in the upward direction. Among the light emitted from the light emitting layer LI, the light traveling in the lateral direction that does not contribute to the front luminance as compared with the light traveling in the upward direction can be made light traveling in the upward direction. Consequently, display device DSP can improve the front luminance. Further, the inclined surface SF has an uneven shape. As compared with a case where the inclined surface SF is a flat surface, the inclined surface SF having the uneven shape more easily reflects light traveling from the sealing layer 31 toward the pixel electrode PEa.

In addition, the light traveling in the lateral direction among the light emitted from the light emitting layer LI can be suppressed from being mixed with the light emitted from the light emitting layer LI of the adjacent light emitting element 10, and the degradation of the display quality can be suppressed.

In the above embodiment, the common electrode CE corresponds to the first electrode and a coating layer, and the pixel electrode PEa corresponds to the second electrode and a light reflecting layer.

When the pixel electrode PEa is made of, for example, a transparent conductive material, the display panel PNL may be provided with a light reflecting layer separately from the pixel electrode PEa, and the light reflecting layer may be provided on the base layer BL side of the pixel electrode PEa.

Here, a cross-sectional structure of the display panel PNL on the X-Z plane has been described. A cross-sectional structure of the display panel PNL in the Y-Z plane defined by the second direction Y and the third direction Z is similar to the cross-sectional structure of the display panel PNL in the X-Z plane.

Figure 8:
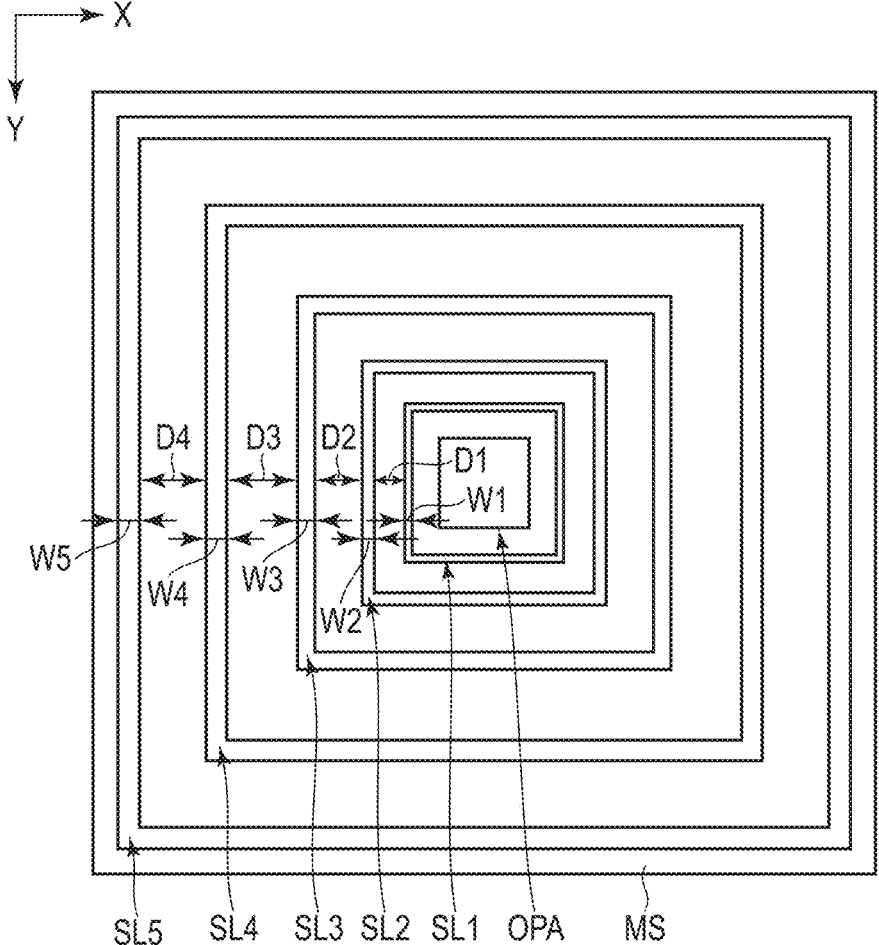
FIG. 8 is a plan view illustrating a mask used in the manufacturing process of FIG. 7.

Next, an example of a method of manufacturing the display panel PNL will be described with reference to FIGS. 7 and 8. FIG. 7 is a cross-sectional view illustrating an example of a manufacturing process of the display panel PNL. FIG. 8 is a plan view illustrating an exposure mask MS used in the manufacturing process of FIG. 7.

First, in FIG. 7(a), the insulating basement 20 is prepared. The base layer BL is formed on the insulating basement 20.

The light emitting element 10 is mounted on the pixel electrode PE of the base layer BL.

In FIG. 7(b), a resist layer 310 covering the base layer BL, the pixel electrode PE, and the light emitting element 10 is formed. The resist layer 310 is temporarily fired and temporarily cured. The resist layer 310 is formed of, for example, a positive photosensitive material from which an exposed portion can be removed.

As illustrated in FIG. 8, the exposure mask MS includes a light transmission portion OPA and a plurality of light transmission portions SL (SL1, SL2, . . . ). The light transmission portion OPA corresponds to the upper surface 10A of the light emitting element 10. The outline of the light transmission portion OPA is similar to the outline of the upper surface 10A in plan view. The plurality of light transmission portions SL are formed in an annular shape surrounding the light transmission portions OPA. Each of the plurality of light transmission portions SL has a similar shape in plan view.

The light transmission portion SL1 is located inside the light transmission portion SL2 at an interval D1 from the light transmission portion SL2 and has a width W1. The light transmission portion SL2 is located inside the light transmission portion SL3 at an interval D2 from the light transmission portion SL3 and has a width W2. The light transmission portion SL3 is located inside the light transmission portion SL4 at an interval D3 from the light transmission portion SL4 and has a width W3. The light transmission portion SL4 is located inside the light transmission portion SL5 at an interval D4 from the light transmission portion SL5 and has a width W4. The light transmission portion SL5 has a width W5. The width W2 is larger than the width W1, and the width W3 is larger than the width W2. The widths W3 to W5 are equivalent in length. The interval D2 is larger than the interval D1, and the interval D3 is larger than the interval D2. The interval D3 and the interval D4 are equivalent in length.

In FIG. 7(c), the exposure mask MS is disposed above the resist layer 310. The resist layer 310 is irradiated with light through the exposure mask MS. The softened layer 312 is a portion of the resist layer 310 that is softened by being irradiated with light passing through the light transmission portions OPA and the light transmission portions SL. As the width of the light transmission portion increases like the light transmission portion SL1 to the light transmission portion SL3, the region of light irradiated to the resist layer 310 increases, and the thickness of the softened layer 312 increases. As a result, the softened layer 312 has an inclined surface TP. When the widths of the light transmission portions are the same as those of the light transmission portions SL3 to SL5, the region of light irradiated to the resist layer 310 is constant, and the thickness of the softened layer 312 is constant. As a result, the softened layer 312 has a flat surface SS.

In FIG. 7(d), the resist layer 310 is developed to remove the softened layer 312. The remaining layer 311 is mainly fired, mainly cured, and brought into close contact with the base layer BL. As a result, the sealing layer 31 having the inclined surface SF and exposing the upper surface 10A of the light emitting element 10 is formed on the base layer BL. The common electrode CE is formed so as to cover the sealing layer 31 and the light emitting element 10. The manufacturing process of the display panel PNL is ended.

FIG. 9 is a cross-sectional view illustrating a display panel PNL according to a modified example of the first embodiment.

As illustrated in FIG. 9, the modified example of the first embodiment is different from the first embodiment illustrated in FIG. 6 in that the display panel PNL further includes a metal layer ML.

The common electrode CE is located between the metal layer ML and the sealing layer 31. The metal layer ML is in contact with the common electrode CE. In the illustrated example, the metal layer ML faces the flat surface SU2 and the inclined surface SF in the third direction Z and does not overlap the upper surface 10A of the light emitting element 10. Note that the metal layer ML only faces the inclined surface SF and does not need to face the flat surface SU2. The metal layer ML is formed of a metal material such as silver (Ag) or Al. The metal layer ML is electrically connected to the common electrode CE. Therefore, an electric resistance of a laminate of the common electrode CE and the metal layer ML can be made lower than an electric resistance of the common electrode CE alone. In addition, the metal layer ML may extend to the non-display area NDA illustrated in FIG. 4 and be filled in a contact hole formed in the sealing layer 31.

Also in the modified example of the first embodiment configured as described above, the same effects as those of the first embodiment can be obtained. In addition, the metal layer ML formed of a metal having a high light reflectance is in contact with the common electrode CE and overlaps the inclined surface SF.

The light emitted from the light emitting layer LI and not reflected by the inclined surface SF travels toward the metal layer ML through the common electrode CE. The light traveling toward the metal layer ML is reflected by a surface facing the inclined surface SF of the metal layer ML, and travels toward the pixel electrode PEa. The light reflected by the pixel electrode PEa travels toward the upper surface 10A. The light traveling in the lateral direction that is not reflected by the inclined surface SF and hardly contributes to the front luminance can be made light traveling in the upward direction that is reflected by the surface of the metal layer ML facing the inclined surface SF and the pixel electrode PEa. As a result, the front luminance of the display device DSP can be further improved.

Next, a display panel PNL of a second embodiment will be described with reference to FIGS. 10 and 11. FIG. 10 is a cross-sectional view illustrating a display panel PNL of the second embodiment. FIG. 11 is a plan view illustrating a layout of pixels PX of the display panel PNL illustrated in FIG. 10.

As illustrated in FIG. 10, the second embodiment is different from the first modified example illustrated in FIG. 5 in that a display panel PNL further includes a planarization layer 41 and a shape of a sealing layer 31 is different.

In the illustrated example, the sealing layer 31 overlaps the pixel electrode PEa, but the pixel electrode PEa is exposed. The sealing layer 31 may cover the pixel electrode PEa. The lower end LE is in contact with the pixel electrode PEa.

The planarization layer 41 is located between the sealing layer 31 and the common electrode CE. The planarization layer 41 continuously covers the sealing layer 31 from the upper end UE to the lower end LE, and also covers a portion of the pixel electrode PEa exposed from the sealing layer 31. In the illustrated example, the upper surface of the planarization layer 41 is located on the same plane as the upper end UE, but the upper surface of the planarization layer 41 may be located closer to the pixel electrode PEa side than the upper end UE in the third direction Z. The planarization layer 41 has a flat surface SU3 on the side opposite to the side facing the base layer BL. The planarization layer 41 has a refractive index n41 smaller than the refractive index n31 of the sealing layer 31. The inclined surface SF of the sealing layer 31 is an interface of layers having different refractive indexes.

Among the light emitted from the light emitting layer LI, the light traveling toward the inclined surface SF is reflected by the inclined surface SF which is an interface of layers having different refractive indexes. Among the light reflected by the inclined surface SF, the light traveling toward the pixel electrode PEa is reflected by the pixel electrode PEa. The light reflected by the pixel electrode PEa travels toward the upper surface 10A.

In FIG. 11, the planarization layer 41 is hatched to the right upward, and the inclined surface SF (sealing layer 31) is hatched to the right downward. As illustrated in FIG. 11, the planarization layer 41 covers the inclined surface SF in plan view, and the cathode CA of each light emitting element 10 is exposed.

Also in the second embodiment configured as described above, the same effects as those of the first embodiment can be obtained.

In the second embodiment described above, the planarization layer 41 corresponds to a coating layer.

Figure 12:
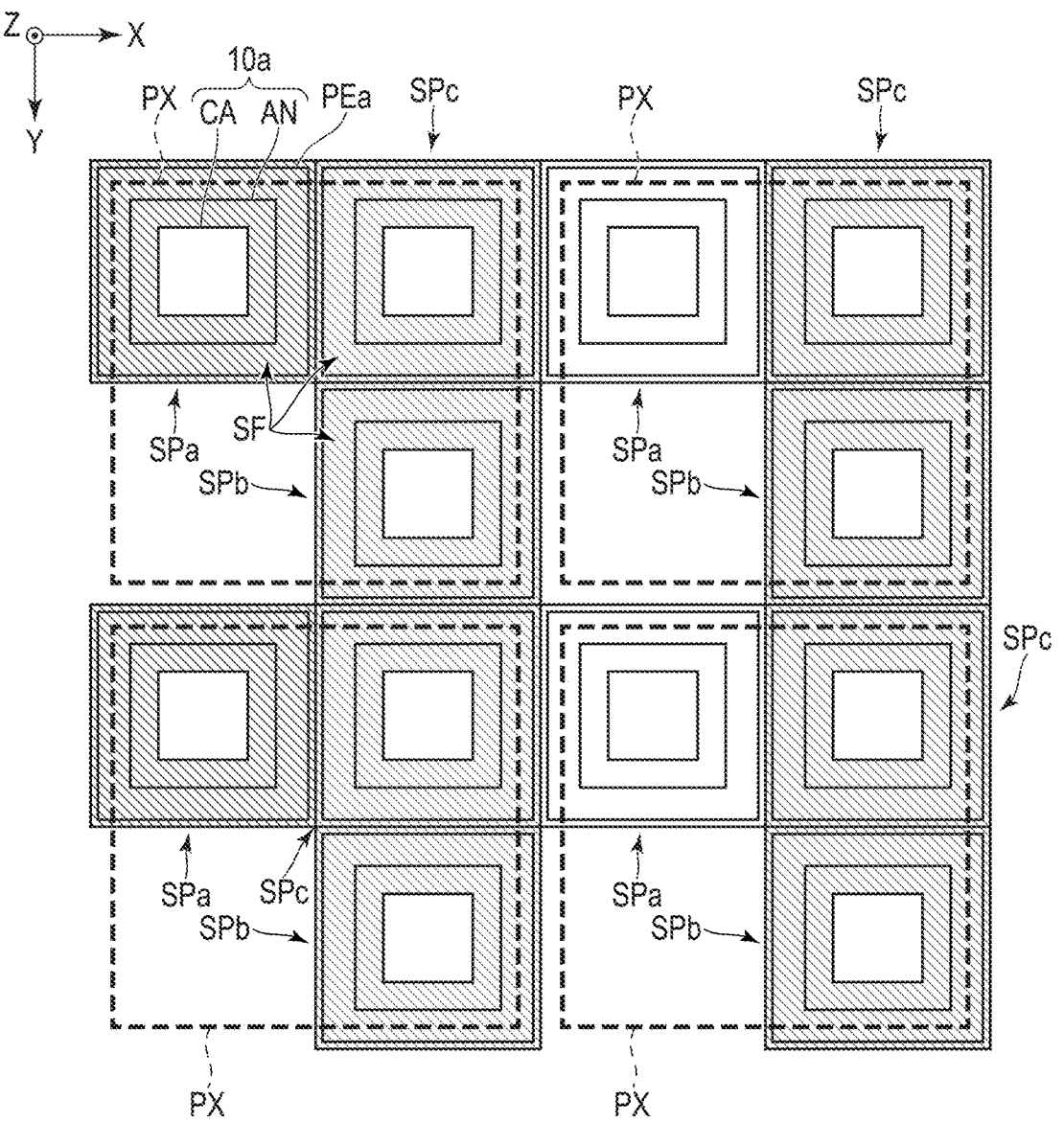
FIG. 12 is a plan view illustrating another example of the pixel layout of the display panel.

Next, another example of the layout of the pixel PX will be described with reference to FIGS. 12 and 13. In FIGS. 12 and 13, the inclined surface SF (sealing layer 31) is hatched.

FIG. 12 is a plan view illustrating one example of the layout of the pixel PX of the present embodiment. As illustrated in FIG. 12, the sub-pixel SPa and the sub-pixel SPc are arranged in the first direction X, and the plurality of sub-pixels SPb are adjacent to each other at a distance in the first direction X. The sub-pixel SPc and the sub-pixel SPb are arranged in the second direction Y, and the plurality of sub-pixels SPa are adjacent to each other with a distance in the second direction Y.

FIG. 13 is a plan view illustrating two examples of the layout of the pixel PX of the present embodiment.

As illustrated in FIG. 13(a), the plurality of sub-pixels SPa are arranged in the first direction X, the plurality of sub-pixels SPb are arranged in the first direction X, and the plurality of sub-pixels SPc are arranged in the first direction X. The sub-pixel SPa, the sub-pixel SPb, and the sub-pixel SPc are arranged in this order in the second direction Y.

As illustrated in FIG. 13(b), the sub-pixel SPa, the sub-pixel SPb, and the sub-pixel SPc of the same pixel PX are arranged in this order in a fourth direction d1 intersecting the first direction X and the second direction Y.

FIG. 14 is a cross-sectional view illustrating another example of the display panel PNL of the second embodiment.

As illustrated in FIG. 14(a), the upper end UE of the sealing layer 31 is located between the anode AN and the cathode CA in plan view, and does not match the outer shape of the cathode CA. The lower end LE of the sealing layer is located between the anode AN and the pixel electrode PE in plan view.

FIG. 14(b) is a cross-sectional view illustrating a first configuration example of the sub-pixel SP illustrated in FIG. 14(a). As illustrated in FIG. 14(b), the upper end UE of the sealing layer 31 is not in contact with the light emitting element 10. The sealing layer 31 may have the above-described shape, for example, due to positional displacement of the exposure mask MS.

FIG. 14(c) is a cross-sectional view illustrating a second configuration example of the sub-pixel SP illustrated in FIG. 14(a). As illustrated in FIG. 14(c), the upper end UE of the sealing layer 31 is in contact with the light emitting layer LI. This is because, for example, the cathode CA side of the light emitting element 10 is exposed when the sealing layer 31 is fired.

In FIGS. 14(b) and 14(c), the upper surface of the planarization layer 41 is located on the same plane as the upper surface 10A of the light emitting element, but the upper surface of the planarization layer 41 may be located closer to the pixel electrode PE than the upper end UE in the third direction Z.

Also in the above configuration example, the same effects as those of the second embodiment can be obtained.

Figure 15:
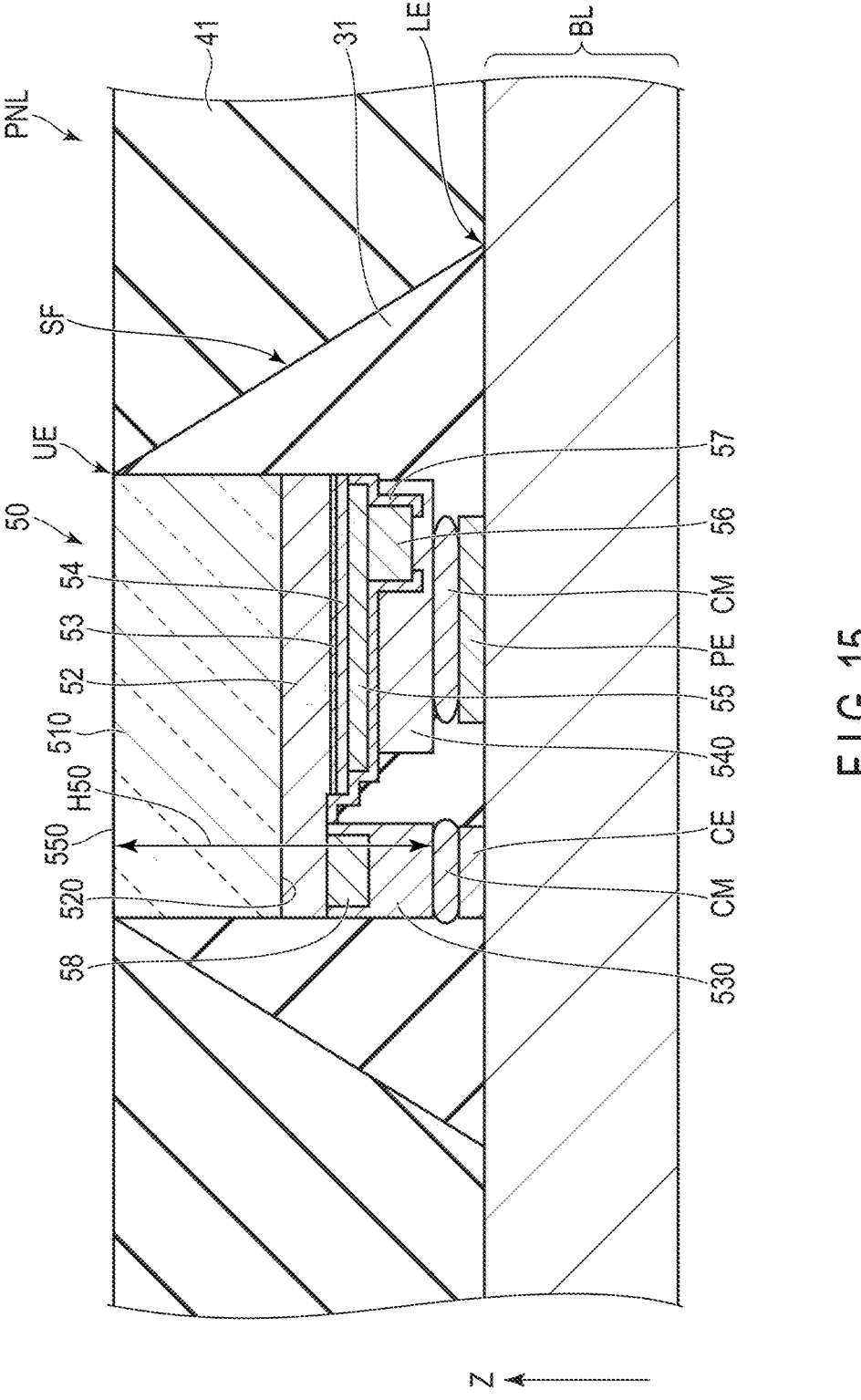
FIG. 15 is a cross-sectional view illustrating another example of the light emitting element of the second embodiment.

FIG. 15 is a cross-sectional view illustrating another example of the light emitting element of the second embodiment.

As illustrated in FIG. 15, the light emitting element 50 is different from the light emitting element 10 illustrated in FIG. 4 in having a different structure.

As illustrated in FIG. 15, the light emitting element 50 is a flip-chip type light-emitting diode element. The light emitting element 50 includes a transparent substrate 510 having an insulating property. The substrate 510 is, for example, a sapphire substrate. The substrate 510 has a bottom surface 520 and a surface (top surface) 550 facing the bottom surface 520. A crystal layer (semiconductor layer) in which an n-type semiconductor layer 52, an active layer (light emitting layer) 53, and a p-type semiconductor layer 54 are sequentially laminated is formed on a bottom surface 520 of the substrate 510. In the crystal layer (semi-conductor layer), a region containing a P-type impurity is the p-type semiconductor layer 54, and a region containing an N-type impurity is the n-type semiconductor layer 52. A material of the crystal layer (semiconductor layer) is not particularly limited, but the crystal layer (semiconductor layer) may contain gallium nitride (GaN) or gallium arsenide (GaAs).

A light reflecting film 55 is formed of a conductive material and is electrically connected to the p-type semi-conductor layer 54. The p-electrode 56 is electrically con-nected to the light reflecting film 55. The n-electrode 58 is electrically connected to the n-type semiconductor layer 52. A pad 530 covers the n-electrode 58 and is electrically connected to the n-electrode 58. The pad 530 is electrically connected to the common electrode CE via the conductive material CM. The protective layer 57 covers the n-type semiconductor layer 52, the active layer 53, the p-type semiconductor layer 54, and the light reflecting film 55, and covers a part of the p-electrode 56. A pad 540 covers the p-electrode 56 and is electrically connected to the p-elec-trode 56. The pad 540 is electrically connected to the pixel electrode PE via the conductive material CM. The light emitting element 50 has a height H50. The height H50 corresponds to a length from the surface of the pad 530 in contact with the conductive material CM to the surface 550 or a length from the surface of the pad 540 in contact with the conductive material CM to the surface 550.

The sealing layer 31 covers the light emitting element 50 and exposes the surface 550. In the height direction (the third direction Z) of the light emitting element 10, the upper end UE is located above the middle of the light emitting element 50, and the lower end LE is located below the middle of the light emitting element 50. In the illustrated example, the upper end UE is located on the same plane as the surface 550, but the upper end UE may be located closer to the base layer BL than the surface 550 in the third direction Z. The upper end UE is preferably located above the middle of the light emitting element 50 in the third direction Z. The lower end LE is in contact with the base layer BL. In the illustrated example, the planarization layer 41 covers all of the inclined surface SF, but the planarization layer 41 may only cover a part of the inclined surface SF. The upper surface of the planarization layer 41 is located on the same plane as the surface 550, but may be located closer to the base layer BL in the third direction Z than the surface 550.

Also in the above configuration example, the same effects as those of the second embodiment can be obtained.

As described above, according to the present embodiment, it is possible to provide a display device capable of improving the front luminance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device, comprising
an organic insulating layer;
a light reflecting layer located above the organic insulating layer;
a light emitting element located above the light reflecting layer;
a sealing layer located above the light reflecting layer and having an inclined surface having a lower end and an upper end closer to the light emitting element than the lower end; and
a coating layer that is in contact with the inclined surface, wherein
an interface between the inclined surface and the coating layer being is configured to reflect light traveling through the sealing layer toward the light reflecting layer, the light emitting element includes a first electrode, a second electrode, and a light emitting layer between the first electrode and the second electrode,
the lower end is located below a middle of the light emitting element in a height direction of the light emitting element,
the upper end is located above the middle of the light emitting element in the height direction of the light emitting element,
the upper end terminates at a same height as a top surface of the second electrode,
the first electrode is connected to the light reflecting layer,
the top surface of the second electrode is in contact with the coating layer, and
the coating layer is a transparent conductive layer made of indium tin oxide.

2. The display device according to claim 1, wherein the inclined surface overlaps the light reflecting layer in plan view.

3. The display device according to claim 2, wherein the inclined surface has an uneven shape.

4. The display device according to claim 2, wherein the sealing layer further has a flat surface connected to the lower end, and
when an angle formed by an extension line from the flat surface and an imaginary straight line connecting the upper end and the lower end is defined as a first angle, the first angle is an acute angle.

5. The display device according to claim 4, wherein the first angle is 20 degrees or more and 50 degrees or less.

6. The display device according to claim 1, further comprising
a metal layer that is in contact with the transparent conductive layer and faces the inclined surface.

7. The display device according to claim 6, wherein the sealing layer further has a flat surface connected to the lower end, and
the metal layer faces the flat surface.

* * * * *